(12) United States Patent
Guo et al.

(10) Patent No.: US 12,540,959 B2
(45) Date of Patent: Feb. 3, 2026

(54) DEVICE AND METHOD FOR MONITORING POWER SUPPLY VOLTAGE OF ELECTRONIC CIRCUIT

(71) Applicants: Beijing Youzhuju Network Technology Co., Ltd., Beijing (CN); Lemon Inc., Grand Cayman (KY)

(72) Inventors: Junyan Guo, Beijing (CN); Weifeng Dong, Beijing (CN); Mingming Zhang, Beijing (CN); Chuang Zhang, Los Angeles, CA (US); Junmou Zhang, Los Angeles, CA (US); Shan Lu, Los Angeles, CA (US); Jian Wang, Beijing (CN)

(73) Assignees: Beijing Youzhuju Network Technology Co., Ltd., Beijing (CN); Lemon Inc., Grand Cayman (KY)

( * ) Notice: Subject to any disclaimer, the term of this patent is extended or adjusted under 35 U.S.C. 154(b) by 126 days.

(21) Appl. No.: 18/604,457

(22) Filed: Mar. 13, 2024

(65) Prior Publication Data

US 2024/0310418 A1   Sep. 19, 2024

(51) Int. Cl.
  *G01R 25/00*    (2006.01)
  *G01R 19/165*   (2006.01)
  *H03K 5/00*     (2006.01)

(52) U.S. Cl.
  CPC ..... *G01R 25/005* (2013.01); *G01R 19/16576* (2013.01); *H03K 5/00006* (2013.01); *H03K 2005/00078* (2013.01)

(58) Field of Classification Search
  CPC ............ G01R 25/005; G01R 19/16576; G01R 19/16538; G01R 31/40; H03K 5/00006; H03K 2005/00078; H02M 1/0012

(Continued)

(56) References Cited

U.S. PATENT DOCUMENTS

2010/0073836 A1  3/2010 Arnold
2021/0376821 A1  12/2021 Chang
(Continued)

FOREIGN PATENT DOCUMENTS

CN   106575961 A   4/2017
CN   111337847 A   6/2020
(Continued)

OTHER PUBLICATIONS

Notification to Grant Patent Rights for Invention received from Chinese patent application No. 202310260003.8 mailed on Mar. 3, 2025, 7 pages (2 pages English Translation and 5 pages Original Copy).

(Continued)

*Primary Examiner* — Giovanni Astacio-Oquendo

(57) ABSTRACT

Embodiments of the present disclosure provide a device and a method for monitoring power supply voltage of an electronic circuit. The device comprising: a voltage regulator configured to process the power supply voltage to generate a predetermined voltage; a critical timing generation module powered by the predetermined voltage and configured to generate a critical timing signal based on an original clock signal and a delay control signal, the critical timing signal being alternately in a first level state and a second level state; a control signal adjustment module configured to adjust the delay control signal based on the critical timing signal, wherein in a case that the critical timing signal is in the first level state, the delay control signal is increased, and in a case that the critical timing signal is in the second level state, the delay control signal is decreased; and a power supply drop sensing module powered by the power supply voltage and configured to generate a drop indication signal based on the original clock signal and the delay control signal, the drop (Continued)

indication signal indicating whether the power supply voltage drops below the predetermined voltage.

20 Claims, 3 Drawing Sheets

(58) Field of Classification Search
USPC .............................. 324/76.77, 76.54, 76.11
See application file for complete search history.

(56) References Cited

U.S. PATENT DOCUMENTS

| | | |
|---|---|---|
| 2022/0006459 A1 | 1/2022 | Bautista Gabriel et al. |
| 2022/0076725 A1 | 3/2022 | Nam et al. |
| 2022/0381807 A1* | 12/2022 | Yoo ........................ G01R 15/04 |
| 2023/0168312 A1* | 6/2023 | Cheng ...................... G01K 7/22 |
| | | 361/91.1 |
| 2025/0110176 A1* | 4/2025 | Jing ................. G01R 19/16585 |

FOREIGN PATENT DOCUMENTS

| | | |
|---|---|---|
| CN | 114008924 A | 2/2022 |
| EP | 0392017 A1 | 7/2018 |
| JP | 2001-332699 A | 11/2001 |
| JP | 08-272491 A | 11/2008 |

OTHER PUBLICATIONS

International Search Report received for PCT Patent Application No. PCT/CN24/080407, mailed on May 28, 2024, 5 pages (2 pages of English Translation and 3 pages of Original Document).

Office action received from Taiwan patent application No. 112109163 mailed on Jun. 2, 2024, 10 pages (3 pages English Translation and 7 pages Original Copy).

\* cited by examiner

DEVICE AND METHOD FOR MONITORING POWER SUPPLY VOLTAGE OF ELECTRONIC CIRCUIT

CROSS REFERENCE

This application is based on Chinese Patent Application No. 2023102600038, filed on Mar. 13, 2023, and entitled "DEVICE AND METHOD FOR MONITORING POWER SUPPLY VOLTAGE OF ELECTRONIC CIRCUIT", and claims priority to the Chinese Patent Application. The entirety of the above-mentioned Chinese Patent Application is incorporated herein by reference.

FIELD

Example embodiments of the present disclosure relate generally to the field of electronic circuit, and in particular to a device and a method for monitoring power supply voltage of electronic circuit.

BACKGROUND

In the field of electronic circuit, a clock signal is used to coordinate actions of various electronic components to ensure that related electronic components can operate synchronously. In integrated circuits, such as digital chips, digital circuits draw current from a power supply network during operation, causing fluctuations in the power supply. When the drawn current is too large, it may cause an instant drop in the power supply voltage to. If the power supply voltage drops too much, timing requirements of the digital circuits will not be met, and a timing error will occur, which will cause the digital circuits to operate improperly and lead to lock-up and other states of the digital circuits.

SUMMARY

A purpose of the present disclosure is to provide a device and a method for monitoring a power supply voltage of an electronic circuit to at least partially solve the above problems and other potential problems.

In a first aspect of the present disclosure, there is provided a device for monitoring a power supply voltage of an electronic circuit, comprising: a voltage regulator configured to process the power supply voltage to generate a predetermined voltage; a critical timing generation module powered by the predetermined voltage, and configured to generate a critical timing signal based on an original clock signal and a delay control signal, the critical timing signal being alternately in a first level state and a second level state; a control signal adjustment module configured to adjust the delay control signal based on the critical timing signal, wherein in a case that the critical timing signal is in the first level state, the delay control signal is increased, and in a case that the critical timing signal is in the second level state, the delay control signal is decreased; and a power supply drop sensing module powered by the power supply voltage and is configured to generate a drop indication signal based on the original clock signal and the delay control signal, the drop indication signal indicating whether the power supply voltage drops below the predetermined voltage.

In a second aspect of the present disclosure, there is provided a method for monitoring a power supply voltage of an electronic circuit, comprising: processing the power supply voltage to generate a predetermined voltage; at the predetermined voltage, generating a critical timing signal based on an original clock signal and a delay control signal, the critical timing signal being alternately in a first level state and a second level state; adjusting the delay control signal based on the critical timing signal, wherein in a case that the critical timing signal is in the first level state, the delay control signal is increased, and in a case that the critical timing signal is in the second level state, the delay control signal is decreased; and at the power supply voltage, generating a drop indication signal based on the original clock signal and the delay control signal, the drop indication signal indicating whether the power supply voltage drops below the predetermined voltage.

In a third aspect of the present disclosure, there is provided an electronic circuit, comprising the device according to the first aspect of the present disclosure.

It should be understood that contents described in this section are not intended to limit critical or important features of the embodiments of the present disclosure, nor is it used to limit the scope of the present disclosure. Other features of the present disclosure will become easier to be understood through the following description.

DESCRIPTION OF THE DRAWINGS

In conjunction with the accompanying drawings and with reference to the following detailed description, the above and other features, advantages and aspects of the various embodiments of the present disclosure will become more apparent. In the accompanying drawings, the same or similar reference numbers represent the same or similar elements, wherein.

DETAILED DESCRIPTION

Figure 1:
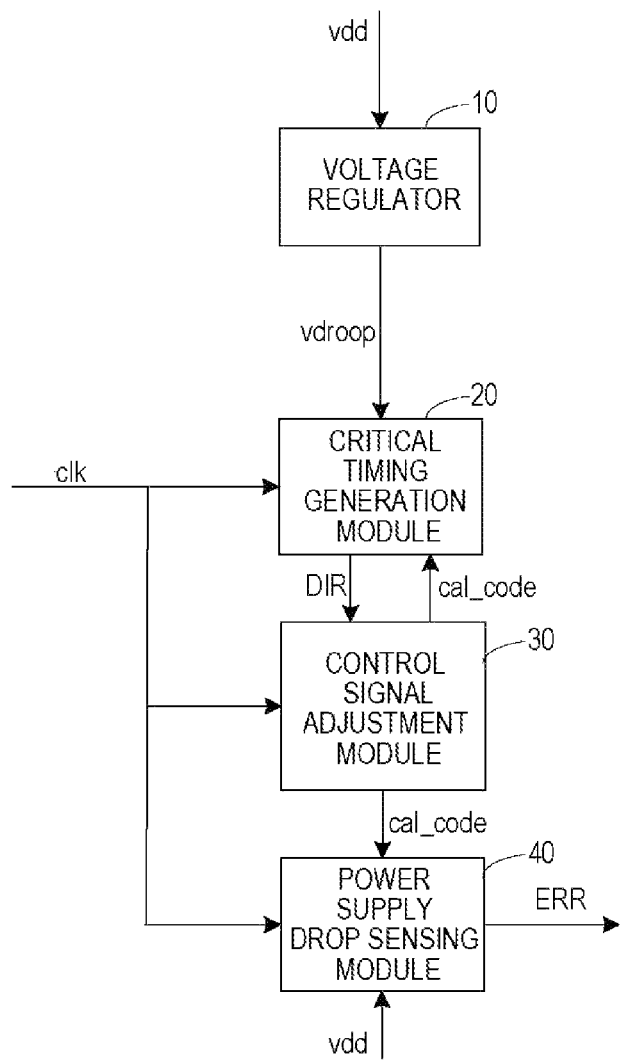
FIG. 1 shows a block diagram of a device for monitoring a power supply voltage of an electronic circuit according to an embodiment of the present disclosure.

Embodiments of the present disclosure will be described in more detail below with reference to the accompanying drawings. Although certain embodiments of the disclosure are illustrated in the drawings, it should be understood that the disclosure may be embodied in various forms and should not be construed as limited to the embodiments set forth herein, on the contrary, these embodiments are provided for a more thorough and complete understanding of the present disclosure. It should be understood that the drawings and embodiments of the present disclosure are for illustrative purposes only and are not intended to limit the scope of the present disclosure.

In the description of embodiments of the present disclosure, the term "comprising" and similar expressions shall be understood as an open inclusion, that is, "comprising but not limited to." The term "based on" should be understood to mean "based at least in part on." The terms "one embodiment" or "the embodiment" should be understood to mean "at least one embodiment". The term "some embodiments"

should be understood to mean "at least some embodiments." Other explicit and implicit definitions may be included below.

As mentioned above, digital circuits draw current from a power supply network during operation, causing fluctuations in the power supply. When the drawn current is too large, it may cause an instant drop in the power supply voltage; if the power supply voltage drops too much, the timing requirements of the digital circuits will not be met, and a timing error will occur. Embodiments of the present disclosure provide a solution for monitoring the power supply voltage of an electronic circuit. In this solution, placing a timing of a digital logic circuit in a critical error state at a stable predetermined voltage, while making the other similar digital logic circuit operate at the power supply voltage to be monitored. When the power supply voltage to be monitored is lower than the predetermined voltage, the other digital logic circuit will generate an indication signal representing an excessive drop in the power supply voltage. In this way, the drop of the power supply voltage can be accurately monitored so that the electronic circuit can take appropriate countermeasures to avoid the timing error caused by the drop of the power supply. The principles of the present disclosure will be described in detail below with reference to FIGS. 1 to 4.

Figure 2:
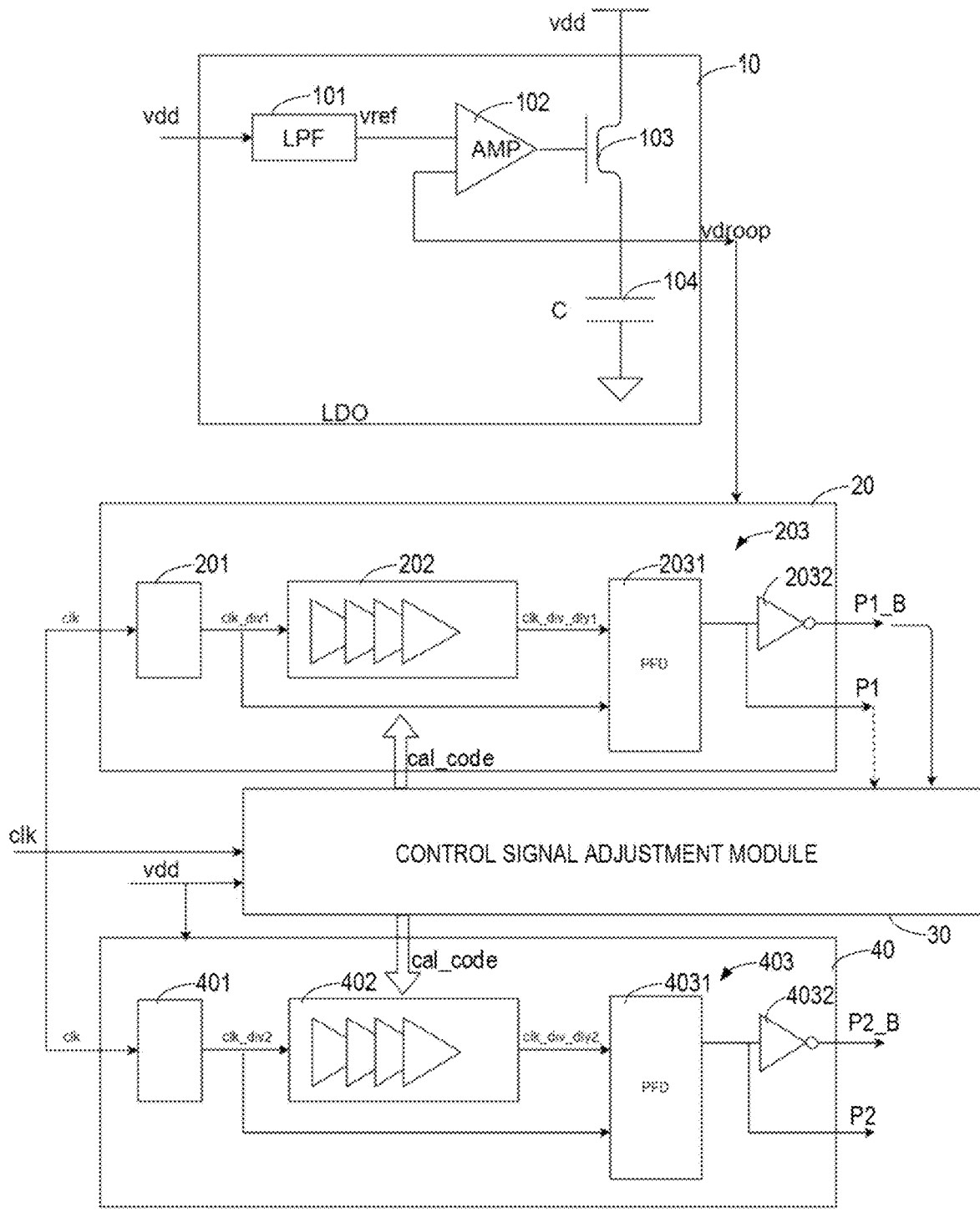
FIG. 2 shows a circuit schematic diagram of a device for monitoring a power supply voltage of an electronic circuit according to an embodiment of the present disclosure.

FIG. 1 shows a block diagram of a device for monitoring a power supply voltage of an electronic circuit according to an embodiment of the present disclosure, FIG. 2 shows a circuit schematic diagram of a device for monitoring a power supply voltage of an electronic circuit according to an embodiment of the present disclosure. As shown in FIGS. 1 and 2, the device described here generally includes a voltage regulator 10, a critical timing generation module 20, a control signal adjustment module 30 and a power supply drop sensing module 40.

The voltage regulator 10 is used to process a power supply voltage vdd to generate a predetermined voltage vdroop. The predetermined voltage vdroop may be a voltage preset according to design requirements of the electronic circuit, which is used as a limit value of the power supply drop to be monitored. That is, when the power supply voltage vdd is above the predetermined voltage vdroop, it means that the timing requirements of the electronic circuit can be basically met; and when the power supply voltage vdd drops below the predetermined voltage vdroop, it means that the timing requirements of the digital circuit cannot be met, a timing error may occur. Whether the power supply voltage vdd drops below the predetermined voltage vdroop can be monitored by the critical timing generation module 20, the control signal adjustment module 30 and the power supply drop sensing module 40, which will be described in detail below.

As an example, when the power supply voltage vdd is 1V, the predetermined voltage vdroop may be preset to 0.8V. Of course, the predetermined voltage vdroop may also be set higher or lower than 0.8V according to the design requirements of the electronic circuit. It should be noted that numbers, values, etc. that may be mentioned here, and elsewhere in the present disclosure, are exemplary and are not intended to limit scope of the present disclosure in any way. Any other appropriate numbers, values are possible.

The voltage regulator 10 may use any appropriate voltage regulation technique to process the power supply voltage vdd. For example, in an embodiment, the voltage regulator 10 may include a low dropout linear voltage regulator (LDO), as shown in FIG. 2. The LDO includes a low-pass filter 101, an amplifier 102, a transistor 103 and a capacitor 104. The low-pass filter 101 is used to perform low-pass filtering on the power supply voltage vdd to filter out high-frequency components in the power supply voltage vdd to generate a filtered voltage vref. The filtered voltage vref is provided to a first input of amplifier 102. The transistor 103 and the capacitor 104 are connected in series between the power supply voltage vdd and ground. The transistor 103 may be a metal-oxide-semiconductor field-effect transistor (MOSFET) or other types of switching devices, embodiments of the present disclosure do not limit this. A control end of transistor 103 is connected to an output end of amplifier 102. An intermediate node between the transistor 103 and the capacitor 104 is connected to a second input of the amplifier 102. The predetermined voltage vdroop is provided by the intermediate node between transistor 103 and capacitor 104. With this arrangement, the voltage regulator 10 is capable of providing a stable predetermined voltage vdroop that is substantially unaffected by fluctuations in the power supply voltage vdd.

Figure 3:
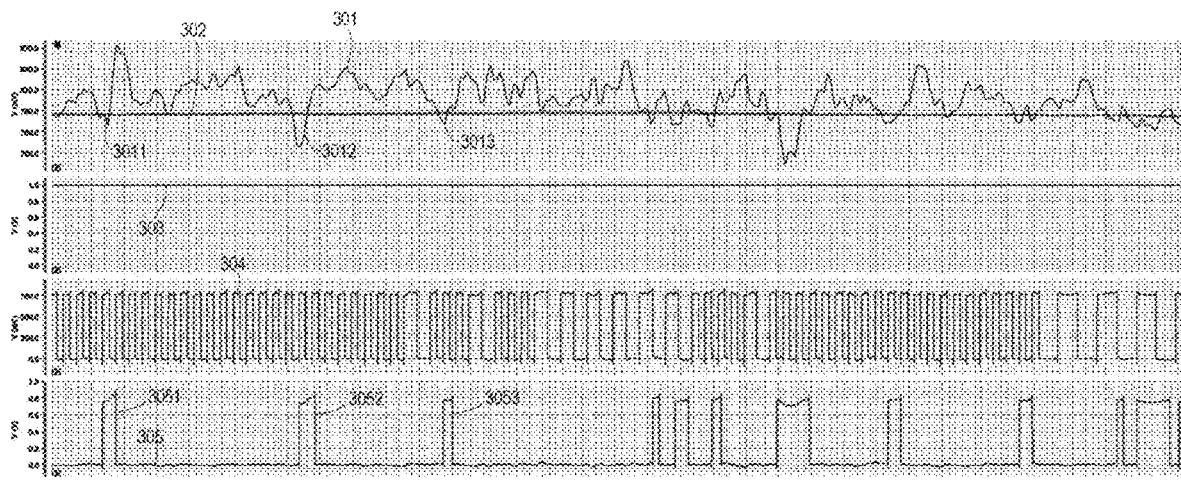
FIG. 3 shows curves of power supply voltage, predetermined voltage, state machine lock signal, critical timing signal and drop indication signal according to an embodiment of the present disclosure.

FIG. 3 shows a curve 301 of the power supply voltage vdd and a curve 302 of the predetermined voltage vdroop according to an embodiment of the present disclosure. As shown in FIG. 3, the power supply voltage vdd fluctuates up and down, while the predetermined voltage vdroop is at a basically stable level. The curve 301 of the power supply voltage vdd includes a plurality of drop parts 3011, 3012, 3013 below the predetermined voltage vdroop. Each drop part in the plurality of drop parts 3011, 3012, 3013 will be monitored by the critical timing generation module 20, the control signal adjustment module 30 and the power supply drop sensing module 40, which will be described in detail below.

It should be understood that the above descriptions are merely examples and are not intended to limit the embodiments of the present disclosure in any way. Any voltage stabilization technology currently known or developed in the future may be used in conjunction with embodiments of the present disclosure to generate the predetermined voltage vdroop.

As shown in FIGS. 1 and 2, the critical timing generation module 20 is connected to an output of the voltage regulator 10 to be powered by the predetermined voltage vdroop. That is, the critical timing generation module 20 operates at the predetermined voltage vdroop. The critical timing generation module 20 is used to generate a critical timing signal DIR based on an original clock signal clk and a delay control signal cal_code provided by the control signal adjustment module 30. The original clock signal clk may have any appropriate duty cycle, for example, the duty cycle may be 50%. Of course, it is also feasible for the duty cycle of the original clock signal clk to be higher or lower than 50%. The delay control signal cal_code is provided by the control signal adjustment module 30 to control a delay amount of a delay unit in the critical timing generation module 20, such as controlling the delay amount of a first delay unit 202, which will be described in detail below. The larger the delay control signal cal_code is, the greater the delay amount of the delay unit is, on the contrary, the smaller the delay control signal cal_code is, the smaller the delay amount of the delay unit is.

At the predetermined voltage vdroop, through control of the delay control signal cal_code, the critical timing signal DIR generated by the critical timing generation module 20 may be alternately in the first level state and the second level state. The first level state and the second level state are relative level states. In an embodiment, the first level state is a high-level state and the second level state is a low-level state. In another embodiment, the first level state is a low-level state and the second level state is a high-level state. The critical timing signal DIR is alternately in the first level state and the second level state, which means that timing of the critical timing generation module 20 at the predetermined voltage vdroop is in a critical error state. In other words, the timing of critical timing generation module 20 at predetermined voltage vdroop can meet requirements, but there is no more adjustment margin. If an operating voltage of the critical timing generation module 20 is lower than the predetermined voltage vdroop, the critical timing generation module 20 will have a timing error.

The following takes the first level state as a high-level state and the second level state as a low-level state as an example to describe the principle of the present disclosure.

In an embodiment, as shown in FIG. 2, the critical timing generation module 20 includes a first frequency divider 201, a first delay unit 202 and a timing determination unit 203.

The first frequency divider 201 is used to divide a frequency of the original clock signal clk to generate a first frequency division signal clk_div1. The first frequency divider 201 may have any appropriate frequency division ratio, such as two divided-frequency, four divided-frequency, etc. The first frequency division signal clk_div1 generated by the first frequency divider 201 will have a duty cycle of 50%.

The first delay unit 202 is used to delay the first frequency division signal clk_div1 to generate a first delay signal clk_div_dly1. A delay amount provided by the first delay unit 202 is controlled by the delay control signal cal_code. Theoretically, when the delay control signal cal_code is 0, the delay amount provided by the first delay unit 202 is 0. The larger the delay control signal cal_code is, the larger the delay amount provided by the first delay unit 202 is. On the contrary, the smaller the delay control signal cal_code is, the smaller the delay amount provided by the first delay unit 202 is.

The timing determination unit 203 is used to generate the critical timing signal DIR based on a phase relationship between the first frequency division signal clk_div1 and the first delay signal clk_div_dly1. In some embodiments, the timing determination unit 203 may include a first phase discriminator 2031 and a first inverter 2032. The first phase discriminator 2031 is used to identify a phase difference between the first frequency division signal clk_div1 and the first delay signal clk_div_dly1 to generate a first phase discrimination signal P1 representing the phase difference. The first phase discrimination signal P1 is inverted by the first inverter 2032 to generate a first inverted signal P1_B. In an embodiment, the first inverted signal P1_B is used as the critical timing signal DIR. In a case that a phase difference of the first frequency division signal clk_div1 and the first delay signal clk_div_dly1 is half a cycle, the first phase discrimination signal P1 will be in a high-level state, and the first inversion signal P1_B will be in a low-level state. Therefore, the critical timing signal DIR is in a low-level state, that is, the second level state. In a case that the phase difference of the first frequency division signal clk_div1 and the first delay signal clk_div_dly1 does not reach half a cycle, the first phase discrimination signal P1 will be in a low-level state, and the first inversion signal P1_B will be in a high-level state. Therefore, the critical timing signal DIR is in a high-level state, that is, the first level state.

In an embodiment of the present disclosure, the first phase discrimination signal P1 may also be used as the critical timing signal DIR. In such an embodiment, the first level state would be a low-level state and the second level state would be a high-level state. Specifically, in a case that the phase difference of the first frequency division signal clk_div1 and the first delay signal clk_div_dly1 is half a cycle, the first phase discrimination signal P1 is in a high-level state. Therefore, the critical timing signal DIR is in a high-level state, that is, the second level state. In a case that the phase difference of the first frequency division signal clk_div1 and the first delay signal clk_div_dly1 does not reach half a cycle, the first phase discrimination signal P1 is in a low-level state. Therefore, the critical timing signal DIR is in a low-level state, that is, the first level state.

FIG. 3 shows a curve 304 of the critical timing signal DIR according to an embodiment of the present disclosure. As shown in FIG. 3, the critical timing signal DIR is alternately in the first level state and the second level state, wherein the first level state is one of the high-level state and the low-level state, and the second level state is another item of the high-level state and the low-level state.

The control signal adjustment module 30 is used to adjust the delay control signal cal_code based on the critical timing signal DIR to dynamically adjust the delay amount provided by the first delay unit 202. In a case that the critical timing signal DIR is in the first level state, the delay control signal cal_code is increased, and in a case that the critical timing signal DIR is in the second level state, the delay control signal cal_code is decreased. As mentioned above, the critical timing signal DIR is in the first level state, which means that the phase difference of the first frequency division signal clk_div1 and the first delay signal clk_div_dly1 do not reach half a cycle, and the critical timing signal DIR is in the second level state, which means that the phase difference of the first frequency division signal clk_div1 and the first delay signal clk_div1 is half a cycle. In a case that the phase difference of the first frequency division signal clk_div1 and the first delay signal clk_div_dly1 does not reach half a cycle, increasing the delay control signal cal_code will cause the delay amount provided by the first delay unit 202 to be increased. In a case that the phase difference of the first frequency division signal clk_div1 and the first delay signal clk_div_dly1 is half a cycle, decreasing the delay control signal cal_code will cause the delay amount provided by the first delay unit 202 to be decreased. In this way, the critical timing signal DIR can be made to be in the first level state and the second level state alternately. That is, by dynamically adjusting the delay control signal cal_code according to the critical timing signal DIR, the timing of the critical timing generation module 20 at the predetermined voltage vdroop can be brought into the critical error state.

In some embodiments, the control signal adjustment module 30 includes a digital state machine, the digital state machine has a first adjustment state for increasing delay control signal cal_code and a second adjustment state for decreasing delay control signal cal_code. In a case that the critical timing signal DIR is in the first level state, the digital state machine will switch to the first adjustment state to increase the amount of delay provided by the first delay unit 202. In a case that the critical timing signal DIR is in the second level state, the digital state machine will switch to the second adjustment state to decrease the delay amount of provided by the first delay unit 202. FIG. 3 also shows a curve 303 of a state machine lock signal. As shown in FIG. 3, when the critical timing signal DIR alternately changes, the state machine lock signal will be enabled, causing the digital state machine to cyclically switch between the first adjustment state and the second adjustment state. In addition, as shown in FIG. 3, the pulse width of the critical timing signal DIR changes dynamically. This is because by dynamically adjusting the delay control signal cal_code, a process-voltage-temperature (PVT) deviation of the electronic circuit can be resisted.

As shown in FIGS. 1 and 2, the power supply drop sensing module 40 is powered by the power supply voltage vdd. That is, the power supply drop sensing module 40 operates at the power supply voltage vdd. The power supply drop sensing module 40 is connected to the control signal adjustment module 30 to receive the delay control signal cal_code generated by the control signal adjustment module 30. The power supply drop sensing module 40 is used to generate a drop indication signal ERR based on the original clock signal clk and the delay control signal cal_code. The drop indication signal ERR indicates whether the power supply voltage vdd drops below the predetermined voltage vdroop. As mentioned above, the timing of critical timing generation module 20 at the predetermined voltage vdroop can meet requirements, but there is no more adjustment margin. If the operating voltage of critical timing generation module 20 is lower than the predetermined voltage vdroop, the timing error will occur in the critical timing generation module 20. By providing the same delay control signal cal_code to the power supply drop sensing module 40 and determining whether there is an error in a timing of controlling the power supply drop sensing module 40 at the power supply voltage vdd, it can be determined whether the power supply voltage vdd drops below the predetermined voltage vdroop. The drop indication signal ERR can be used as an alarm signal to instruct the electronic circuit to take corresponding countermeasures to avoid the timing error caused by the drop of the power supply.

In an embodiment, the power supply drop sensing module 40 includes a second frequency divider 401, a second delay unit 402 and a power supply drop determination module 403.

The second frequency divider 401 is used to divide a frequency of the original clock signal clk to generate a second frequency division signal clk_div2. The second frequency divider 401 may have any appropriate frequency division ratio, such as two divided-frequency, four divided-frequency, etc. The second frequency division signal clk_div2 generated by the second frequency divider 401 will have a duty cycle of 50%. In some embodiments, the second frequency divider 401 and the first frequency divider 201 may have the same frequency division ratio.

The second delay unit 402 is used to delay the second frequency division signal clk_div2 to generate a second delay signal clk_div_dly2. A delay amount provided by the second delay unit 402 is also controlled by the delay control signal cal_code. Since the same delay control signal cal_code is provided to the first delay unit 202 and the second delay unit 402, the first delay unit 202 and the second delay unit 402 have similar delay characteristics. The larger the delay control signal cal_code is, the larger the delay amount provided by the second delay unit 402 is. On the contrary, the smaller the delay control signal cal_code is, the smaller the delay amount provided by the second delay unit 402 is. In some embodiments, the second delay unit 402 and the first delay unit 202 may have the same circuit structure. In some embodiments, the delay amount of provided by the second delay unit 402 and the first delay unit 202 may change substantially in synchronization with the delay control signal cal_code.

The delay amount of the delay unit is also related to its operating voltage. The higher the operating voltage is, the smaller the delay amount provided by the delay unit is, and the lower the operating voltage is, the greater the delay amount provided by the delay unit is. Therefore, if the power supply voltage vdd is higher than the predetermined voltage vdroop at a certain moment, the delay amount provided by the second delay unit 402 will be lower than the delay amount provided by the first delay unit 202. On the contrary, if the power supply voltage vdd is lower than the predetermined voltage vdroop at a certain moment, the delay amount provided by the second delay unit 402 will be higher than the delay amount provided by the first delay unit 202.

The power supply drop determination module 403 is used to generate the drop indication signal ERR based on a phase relationship between the second frequency division signal clk_div2 and the second delay signal clk_div_dly2. In some embodiments, the power supply drop determination module 403 may include a second phase discriminator 4031 and a second inverter 4032. The second phase discriminator 4031 is used to identify the phase difference between the second frequency division signal clk_div2 and the second delay signal clk_div_dly2 to generate a second phase discrimination signal P2 representing the phase difference. The second phase discrimination signal P2 is inverted by the second inverter 4032 to generate a second inverted signal P2_B.

In a case that the phase difference of the second frequency division signal clk_div2 and the second delay signal clk_div_dly2 does not reach half a cycle, the second phase discrimination signal P2 will be in a low-level state, and the second inversion signal P2_B will be in a high-level state. For example, if the power supply voltage vdd is higher than the predetermined voltage vdroop at a certain moment, the delay amount provided by the second delay unit 402 will be lower than the delay amount provided by the first delay unit 202, so that the phase difference of the second frequency division signal clk_div2 and the second delay signal clk_div_dly2 does not reach half a cycle, therefore the second phase discrimination signal P2 will be in a low-level state, and the second inversion signal P2_B will be in a high-level state. In a case that the phase difference of the second frequency division signal clk_div2 and the second delay signal clk_div_dly2 is half a cycle, the second phase discrimination signal P2 will be in a high-level state, and the second inversion signal P2_B will be in a low-level state. For example, if the power supply voltage vdd is lower than the predetermined voltage vdroop at a certain moment, the delay amount provided by the second delay unit 402 will be higher than the delay amount provided by the first delay unit 202, so that the phase difference of the second frequency division signal clk_div2 and the second delay signal clk_div_dly2 has experienced half-cycle, therefore the second phase discrimination signal P2 will be in a high-level state, and the second inverted signal P2_B will be in a low-level state.

In an embodiment, the second phase discrimination signal P2 is used as the drop indication signal ERR. In such an embodiment, when the power supply voltage vdd is higher than the predetermined voltage vdroop, the drop indication signal ERR will be in a low state, and when the power supply voltage vdd drops below the predetermined voltage vdroop, the drop indication signal ERR will be in a high state. As shown in FIG. 3, when the power supply voltage vdd is higher than the predetermined voltage vdroop, the drop indication signal ERR will be in a low-level state. When the power supply voltage vdd has a plurality of drop parts 3011, 3012, and 3013 lower than the predetermined voltage vdroop, the drop indication signal ERR will have a plurality of abnormal indication parts 3051, 3052, and 3053 having a high-level state. In this way, the drop of the power supply voltage vdd can be accurately monitored so that the electronic circuit can take corresponding countermeasures to avoid timing errors caused by the drop of the power supply.

In an embodiment, the second inverted signal P2_B is used as the drop indication signal ERR. In such an embodiment, when the power supply voltage vdd is higher than the predetermined voltage vdroop, the drop indication signal ERR will be in a high state, and when the power supply voltage vdd drops below the predetermined voltage vdroop, the drop indication signal ERR will be in a low state. With such an embodiment, the drop of the power supply voltage vdd can also be accurately monitored.

Figure 4:
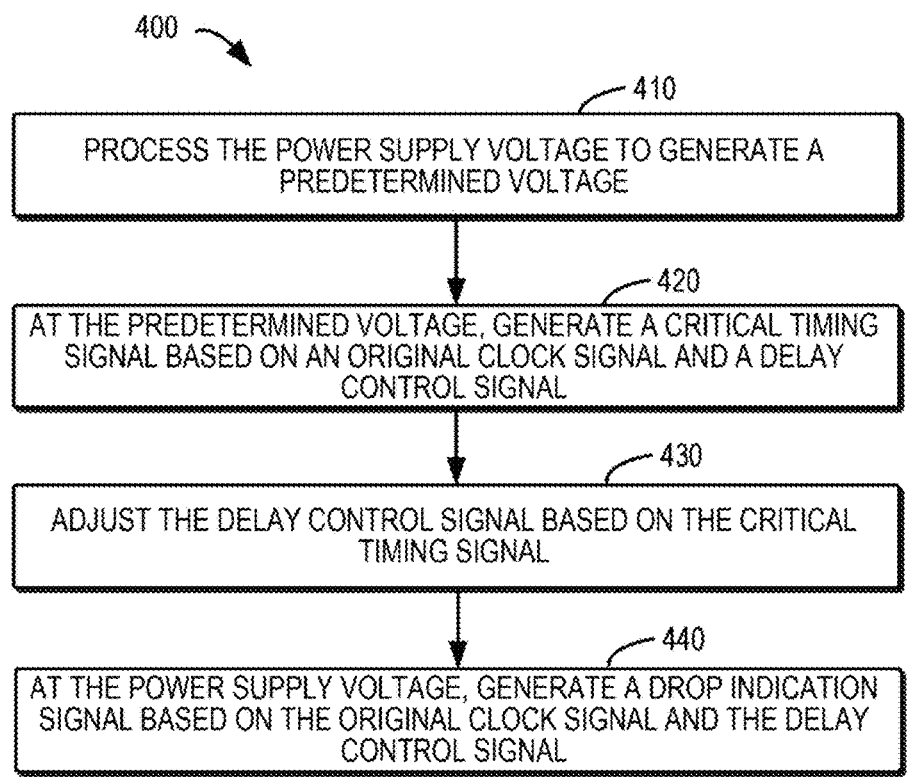
FIG. 4 shows a flowchart of a method for monitoring power supply voltage of an electronic circuit according to an embodiment of the present disclosure.

The embodiment of the present disclosure also provides a method 400 for monitoring the power supply voltage of an electronic circuit, as shown in FIG. 4. The method 400 may be performed by the device for monitoring the power supply voltage of an electronic circuit as described above in conjunction with FIGS. 1 to 3. As shown in FIG. 4, the method 400 includes: at block 410, processing the power supply voltage vdd to generate a predetermined voltage vdroop; at block 420, at the predetermined voltage vdroop, generating a critical timing signal DIR based on the original clock signal clk and the delay control signal cal_code, the critical timing signal being alternately in the first level state and the second level state; at block 430, adjusting the delay control signal cal_code based on the critical timing signal DIR, wherein in a case that the critical timing signal DIR is in the first level state, the delay control signal cal_code is increased, and in a case that the critical timing signal DIR is in the second level state, the delay control signal cal_code is decreased; and at block 440, at the power supply voltage vdd, generating a drop indication signal ERR based on the original clock signal clk and the delay control signal cal_code, the drop indication signal ERR indicating whether the power supply voltage vdd drops below the predetermined voltage vdroop.

In some embodiments, generating the critical timing signal DIR based on the original clock signal clk and the delay control signal cal_code includes: dividing a frequency of the original clock signal clk to generate a first frequency division signal clk_div1; delaying the first frequency division signal clk_div1 to generate a first delay signal clk_div_dly1, wherein a delay amount on the first frequency division signal clk_div1 is controlled by the delay control signal cal_code; and generating the critical timing signal DIR based on a phase relationship between the first frequency division signal clk_div1 and the first delay signal clk_div_dly1, wherein in a case that the phase difference of the first frequency division signal clk_div1 and the first delay signal clk_div_dly1 is half a cycle, the critical timing signal DIR is in the second level state, and in a case that the phase difference of the first frequency division signal clk_div1 and the first delay signal clk_div_dly1 does not reach a half cycle, the critical timing signal DIR is in the first level state.

In some embodiments, generating a critical timing signal DIR based on the phase relationship between the first frequency division signal clk_div1 and the first delay signal clk_div_dly1 includes: identifying the phase difference between the first frequency division signal clk_div1 and the first delay signal clk_div_dly1 to generate a first phase discrimination signal P1 representing the phase difference, wherein the first phase discrimination signal P1 or an inversion signal of the first phase discrimination signal P1 is used as the critical timing signal DIR.

In some embodiments, generating a drop indication signal ERR based on the original clock signal clk and the delay control signal cal_code includes: dividing a frequency of the original clock signal clk to generate a second frequency division signal clk_div2; delaying the second frequency division signal clk_div2 to generate a second delay signal clk_div_dly2, wherein a delay amount on the second frequency division signal clk_div2 is controlled by the delay control signal cal_code; and generating the drop indication signal ERR based on a phase relationship between the second frequency division signal clk_div2 and the second delay signal clk_div_dly2.

In some embodiments, generating the drop indication signal ERR based on the phase relationship between the second frequency division signal clk_div2 and the second delay signal clk_div_dly2 includes: identifying a phase difference between the second frequency division signal clk_div2 and the second delay signal clk_div_dly2 to generate a second phase discrimination signal P2 representing the phase difference, wherein the second phase discrimination signal P2 or an inversion signal of the second phase discrimination signal P2 is used as the drop indication signal ERR.

In some embodiments, the adjustment of the delay control signal cal_code is achieved by a digital state machine. The digital state machine includes a first adjustment state for increasing the delay control signal cal_code and a second adjustment state for decreasing the delay control signal cal_code, wherein in a case that the critical timing signal DIR is in the first level state, the digital state machine switches to the first adjustment state, and in a case that the critical timing signal DIR is in the second level state, the digital state machine switches to the second adjustment state.

Embodiments of the present disclosure are also embodied in the following examples.

Example 1. A device for monitoring a power supply voltage of an electronic circuit, comprising:
  a voltage regulator configured to process the power supply voltage to generate a predetermined voltage;
  a critical timing generation module powered by the predetermined voltage and configured to generate a critical timing signal based on an original clock signal and a delay control signal, the critical timing signal being alternately in a first level state and a second level state;
  a control signal adjustment module configured to adjust the delay control signal based on the critical timing signal, wherein in a case that the critical timing signal is in the first level state, the delay control signal is increased, and in a case that the critical timing signal is in the second level state, the delay control signal is decreased; and
  a power supply drop sensing module powered by the power supply voltage and configured to generate a drop indication signal based on the original clock signal and the delay control signal, the drop indication signal indicating whether the power supply voltage drops below the predetermined voltage.

Example 2. The device according to Example 1, wherein the critical timing generation module comprises:
  a first frequency divider configured to divide a frequency of the original clock signal to generate a first frequency division signal;
  a first delay unit configured to delay the first frequency division signal to generate a first delay signal, wherein a delay amount provided by the first delay unit is controlled by the delay control signal; and
  a timing determination unit configured to generate the critical timing signal based on a phase relationship between the first frequency division signal and the first delay signal, wherein in a case that a phase difference of the first frequency division signal and the first delay signal is half a cycle, the critical timing signal is in the second level state, and in a case that the phase difference of the first frequency division signal and the first delay signal does not reach half a cycle, the critical timing signal is in the first level state.

Example 3. The device according to Example 2, wherein the timing determination unit comprises:
a first phase discriminator configured to identify the phase difference between the first frequency division signal and the first delay signal to generate a first phase discrimination signal representing the phase difference, wherein the first phase discrimination signal or an inversion signal of the first phase discrimination signal is used as the critical timing signal.

Example 4. The device according to Example 2, wherein the power supply drop sensing module comprises:
a second frequency divider is configured to divide a frequency of the original clock signal to generate a second frequency division signal;
a second delay unit configured to delay the second frequency division signal to generate a second delay signal, wherein a delay amount provided by the second delay unit is controlled by the delay control signal; and
a power supply drop determination module configured to generate the drop indication signal based on a phase relationship between the second frequency division signal and the second delay signal.

Example 5. The device according to Example 4, wherein the power supply drop determination module comprises:
a second phase discriminator configured to identify a phase difference between the second frequency division signal and the second delay signal to generate a second phase discrimination signal representing the phase difference, wherein the second phase discrimination signal or an inversion signal of the second phase discrimination signal is used as the drop indication signal.

Example 6. The device according to Example 4, wherein the second frequency divider and the first frequency divider have the same frequency division ratio.

Example 7. The device according to Example 4, wherein the second delay unit and the first delay unit have the same circuit structure.

Example 8. The device according to example 1, wherein the control signal adjustment module comprises a digital state machine, the digital state machine has a first adjustment state for increasing the delay control signal and a second adjustment state for decreasing the delay control signal, wherein in a case that the critical timing signal is in the first level state, the digital state machine switches to the first adjustment state, and in a case that the critical timing signal is in the second level state, the digital state machine switches to the second adjustment state.

Example 9. The device according to Example 1, wherein the voltage regulator comprises:
A low-pass filter configured to perform low-pass filtering on the power supply voltage to generate a filtered voltage;
an amplifier having a first input receiving the filtered voltage; and
a transistor and a capacitor connected in series between the power supply voltage and ground, wherein a control end of the transistor is connected to an output end of the amplifier, an intermediate node between the transistor and the capacitor is connected to a second input of the amplifier, the intermediate node provides the predetermined voltage.

Example 10. A method for monitoring the power supply voltage of an electronic circuit, comprising:
processing the power supply voltage to generate a predetermined voltage;
at the predetermined voltage, generating a critical timing signal based on an original clock signal and a delay control signal, the critical timing signal being alternately in a first level state and a second level state;
adjusting the delay control signal based on the critical timing signal, wherein in a case that the critical timing signal is in the first level state, the delay control signal is increased, and in a case that the critical timing signal is in the second level state, the delay control signal is decreased; and
at the power supply voltage, generating a drop indication signal based on the original clock signal and the delay control signal, the drop indication signal indicating whether the power supply voltage drops below the predetermined voltage.

Example 11. The method according to Example 10, wherein generating the critical timing signal based on an original clock signal and a delay control signal comprises:
dividing a frequency of the original clock signal to generate a first frequency division signal;
delaying the first frequency division signal to generate a first delay signal, wherein a delay amount on the first frequency division signal is controlled by the delay control signal; and
generating the critical timing signal based on a phase relationship between the first frequency division signal and the first delay signal, wherein in a case that a phase difference of the first frequency division signal and the first delay signal is half a cycle, the critical timing signal is in the second level state, and in a case that the phase difference of the first frequency division signal and the first delay signal does not reach half a cycle, the critical timing signal is in the first level state.

Example 12. The method of Example 11, wherein generating the critical timing signal based on a phase relationship between the first frequency division signal and the first delay signal comprises:
identifying the phase difference between the first frequency division signal and the first delay signal to generate a first phase discrimination signal representing the phase difference, wherein the first phase discrimination signal or an inversion signal of the first phase discrimination signal is used as the critical timing signal.

Example 13. The method according to Example 11, wherein generating a drop indication signal based on the original clock signal and the delay control signal comprises:
dividing a frequency of the original clock signal to generate a second frequency division signal;
delaying the second frequency division signal to generate a second delay signal, wherein a delay amount on the second frequency division signal is controlled by the delay control signal; and
generating the drop indication signal based on a phase relationship between the second frequency division signal and the second delay signal.

Example 14. The method according to Example 13, wherein generating the drop indication signal based on a phase relationship between the second frequency division signal and the second delay signal comprises:

identifying a phase difference between the second frequency division signal and the second delay signal to generate a second phase discrimination signal representing the phase difference, wherein the second phase discrimination signal or an inversion signal of the second phase discrimination signal is used as the drop indication signal.

Example 15. The method according to example 10, wherein the adjustment of the delay control signal is achieved by a digital state machine, the digital state machine comprises a first adjustment state for increasing the delay control signal and a second adjustment state for decreasing the delay control signal, wherein in a case that the critical timing signal is in the first level state, the digital state machine switches to the first adjustment state, and in a case that the critical timing signal is in the second level state, the digital state machine switches to the second adjustment state.

Example 16. An electronic circuit comprising the device according to any one of Examples 1 to 9.

Implementations of the present disclosure have been described above, the above description is illustrative, not exhaustive, and is not limited to the disclosed implementations. Many modifications and variations will be apparent to those of ordinary skill in the art without departing from the scope and spirit of the described implementations. The terminology used herein is chosen to best explain the principles, practical applications, or improvements to the technology in the market, or to enable other persons of ordinary skill in the art to understand the various implementations disclosed herein.

What is claimed is:

1. A device for monitoring a power supply voltage of an electronic circuit, comprising:
   a voltage regulator configured to process the power supply voltage to generate a predetermined voltage;
   a critical timing generation module powered by the predetermined voltage and configured to generate a critical timing signal based on an original clock signal and a delay control signal, the critical timing signal being alternately in a first level state and a second level state;
   a control signal adjustment module configured to adjust the delay control signal based on the critical timing signal, wherein in a case that the critical timing signal is in the first level state, the delay control signal is increased, and in a case that the critical timing signal is in the second level state, the delay control signal is decreased; and
   a power supply drop sensing module powered by the power supply voltage and configured to generate a drop indication signal based on the original clock signal and the delay control signal, the drop indication signal indicating whether the power supply voltage drops below the predetermined voltage.

2. The device of claim 1, wherein the critical timing generation module comprises:
   a first frequency divider configured to divide a frequency of the original clock signal to generate a first frequency division signal;
   a first delay unit configured to delay the first frequency division signal to generate a first delay signal, wherein a delay amount provided by the first delay unit is controlled by the delay control signal; and
   a timing determination unit configured to generate the critical timing signal based on a phase relationship between the first frequency division signal and the first delay signal, wherein in a case that a phase difference of the first frequency division signal and the first delay signal is half a cycle, the critical timing signal is in the second level state, and in a case that the phase difference of the first frequency division signal and the first delay signal does not reach half a cycle, the critical timing signal is in the first level state.

3. The device of claim 2, wherein the timing determination unit comprises:
   a first phase discriminator configured to identify the phase difference between the first frequency division signal and the first delay signal to generate a first phase discrimination signal representing the phase difference, wherein the first phase discrimination signal or an inversion signal of the first phase discrimination signal is used as the critical timing signal.

4. The device of claim 2, wherein the power supply drop sensing module comprises:
   a second frequency divider configured to divide a frequency of the original clock signal to generate a second frequency division signal;
   a second delay unit configured to delay the second frequency division signal to generate a second delay signal, wherein a delay amount provided by the second delay unit is controlled by the delay control signal; and
   a power supply drop determination module configured to generate the drop indication signal based on a phase relationship between the second frequency division signal and the second delay signal.

5. The device of claim 4, wherein the power supply drop determination module comprises:
   a second phase discriminator configured to identify a phase difference between the second frequency division signal and the second delay signal to generate a second phase discrimination signal representing the phase difference, wherein the second phase discrimination signal or an inversion signal of the second phase discrimination signal is used as the drop indication signal.

6. The device of claim 4, wherein the second frequency divider and the first frequency divider have the same frequency division ratio.

7. The device of claim 4, wherein the second delay unit and the first delay unit have the same circuit structure.

8. The device of claim 1, wherein the control signal adjustment module comprises a digital state machine, the digital state machine has a first adjustment state for increasing the delay control signal and a second adjustment state for decreasing the delay control signal, wherein in a case that the critical timing signal is in the first level state, the digital state machine switches to the first adjustment state, and in a case that the critical timing signal is in the second level state, the digital state machine switches to the second adjustment state.

9. The device of claim 1, wherein the voltage regulator comprises:
   a low-pass filter configured to perform low-pass filtering on the power supply voltage to generate a filtered voltage;
   an amplifier having a first input receiving the filtered voltage; and
   a transistor and capacitor connected in series between the power supply voltage and ground, wherein a control end of the transistor is connected to an output end of the amplifier, an intermediate node between the transistor and the capacitor is connected to a second input of the amplifier, the intermediate node provides the predetermined voltage.

10. A method for monitoring a power supply voltage of an electronic circuit, comprising:
- processing the power supply voltage to generate a predetermined voltage;
- at the predetermined voltage, generating a critical timing signal based on an original clock signal and a delay control signal, the critical timing signal being alternately in a first level state and a second level state;
- adjusting the delay control signal based on the critical timing signal, wherein in a case that the critical timing signal is in the first level state, the delay control signal is increased, and in a case that the critical timing signal is in the second level state, the delay control signal is decreased; and
- at the power supply voltage, generating a drop indication signal based on the original clock signal and the delay control signal, the drop indication signal indicating whether the power supply voltage drops below the predetermined voltage.

11. The method of claim 10, wherein generating a critical timing signal based on an original clock signal and a delay control signal comprises:
- dividing a frequency of the original clock signal to generate a first frequency division signal;
- delaying the first frequency division signal to generate a first delay signal, wherein a delay amount on the first frequency division signal is controlled by the delay control signal; and
- generating the critical timing signal based on a phase relationship between the first frequency division signal and the first delay signal, wherein in a case that a phase difference of the first frequency division signal and the first delay signal is half a cycle, the critical timing signal is in the second level state, and in a case that the phase difference of the first frequency division signal and the first delay signal does not reach half a cycle, the critical timing signal is in the first level state.

12. The method of claim 11, wherein generating the critical timing signal based on a phase relationship between the first frequency division signal and the first delay signal comprises:
- identifying the phase difference between the first frequency division signal and the first delay signal to generate a first phase discrimination signal representing the phase difference, wherein the first phase discrimination signal or an inversion signal of the first phase discrimination signal is used as the critical timing signal.

13. The method of claim 11, wherein generating a drop indication signal based on the original clock signal and the delay control signal comprises:
- dividing a frequency of the original clock signal to generate a second frequency division signal;
- delaying the second frequency division signal to generate a second delay signal, wherein a delay amount on the second frequency division signal is controlled by the delay control signal; and
- generating the drop indication signal based on a phase relationship between the second frequency division signal and the second delay signal.

14. The method of claim 13, wherein generating the drop indication signal based on a phase relationship between the second frequency division signal and the second delay signal comprises:
- identifying a phase difference between the second frequency division signal and the second delay signal to generate a second phase discrimination signal representing the phase difference, wherein the second phase discrimination signal or an inversion signal of the second phase discrimination signal is used as the drop indication signal.

15. The method of claim 10, wherein the adjustment of the delay control signal is achieved by a digital state machine, the digital state machine comprises a first adjustment state for increasing the delay control signal and a second adjustment state for decreasing the delay control signal, wherein in a case that the critical timing signal is in the first level state, the digital state machine switches to the first adjustment state, and in a case that the critical timing signal is in the second level state, the digital state machine switches to the second adjustment state.

16. An electronic circuit comprising a device for monitoring a power supply voltage, the device comprising:
- a voltage regulator configured to process the power supply voltage to generate a predetermined voltage;
- a critical timing generation module powered by the predetermined voltage and configured to generate a critical timing signal based on an original clock signal and a delay control signal, the critical timing signal being alternately in a first level state and a second level state;
- a control signal adjustment module configured to adjust the delay control signal based on the critical timing signal, wherein in a case that the critical timing signal is in the first level state, the delay control signal is increased, and in a case that the critical timing signal is in the second level state, the delay control signal is decreased; and
- a power supply drop sensing module powered by the power supply voltage and configured to generate a drop indication signal based on the original clock signal and the delay control signal, the drop indication signal indicating whether the power supply voltage drops below the predetermined voltage.

17. The electronic circuit of claim 16, wherein the critical timing generation module comprises:
- a first frequency divider configured to divide a frequency of the original clock signal to generate a first frequency division signal;
- a first delay unit configured to delay the first frequency division signal to generate a first delay signal, wherein a delay amount provided by the first delay unit is controlled by the delay control signal; and
- a timing determination unit configured to generate the critical timing signal based on a phase relationship between the first frequency division signal and the first delay signal, wherein in a case that a phase difference of the first frequency division signal and the first delay signal is half a cycle, the critical timing signal is in the second level state, and in a case that the phase difference of the first frequency division signal and the first delay signal does not reach half a cycle, the critical timing signal is in the first level state.

18. The electronic circuit of claim 17, wherein the timing determination unit comprises:
- a first phase discriminator configured to identify the phase difference between the first frequency division signal and the first delay signal to generate a first phase discrimination signal representing the phase difference, wherein the first phase discrimination signal or an inversion signal of the first phase discrimination signal is used as the critical timing signal.

19. The electronic circuit of claim 17, wherein the power supply drop sensing module comprises:
- a second frequency divider configured to divide a frequency of the original clock signal to generate a second frequency division signal;
- a second delay unit configured to delay the second frequency division signal to generate a second delay signal, wherein a delay amount provided by the second delay unit is controlled by the delay control signal; and
- a power supply drop determination module configured to generate the drop indication signal based on a phase relationship between the second frequency division signal and the second delay signal.

20. The electronic circuit of claim 19, wherein the power supply drop determination module comprises:
- a second phase discriminator configured to identify a phase difference between the second frequency division signal and the second delay signal to generate a second phase discrimination signal representing the phase difference, wherein the second phase discrimination signal or an inversion signal of the second phase discrimination signal is used as the drop indication signal.

* * * * *